(12) United States Patent
Oono et al.

(10) Patent No.: US 7,085,587 B2
(45) Date of Patent: Aug. 1, 2006

(54) SIGNAL PROCESSING SEMICONDUCTOR INTEGRATED CIRCUIT DEVICE AND WIRELESS COMMUNICATION SYSTEM

(75) Inventors: Ikuya Oono, Takasaki (JP); Toshiki Matsui, Takasaki (JP); Hirotaka Oosawa, Isesaki (JP)

(73) Assignee: Renesas Technology Corp., Tokyo (JP)

( * ) Notice: Subject to any disclaimer, the term of this patent is extended or adjusted under 35 U.S.C. 154(b) by 534 days.

(21) Appl. No.: 10/033,792

(22) Filed: Jan. 3, 2002

(65) Prior Publication Data

US 2002/0094792 A1 Jul. 18, 2002

(30) Foreign Application Priority Data

Jan. 12, 2001 (JP) ........................... 2001-005574

(51) Int. Cl.
*H04B 1/04* (2006.01)

(52) U.S. Cl. ............... 455/553.1; 455/118; 455/252.1; 455/253.2; 455/251.1

(58) Field of Classification Search ............ 455/251.1, 455/252.1, 253.2, 307, 179.1, 76, 86, 73, 455/550.1, 78, 333, 280, 88, 144, 154.2, 455/195.1, 232.1, 234.1, 234.2, 239.1, 241.1, 455/247.1, 250.1, 283, 285, 341, 343.1, 323
See application file for complete search history.

(56) References Cited

U.S. PATENT DOCUMENTS

| | | | |
|---|---|---|---|
| 5,557,641 A | 9/1996 | Weinberg | 375/295 |
| 5,819,161 A | 10/1998 | Saito | 455/86 |
| 5,822,366 A | 10/1998 | Rapeli | 375/219 |
| 5,898,907 A | 4/1999 | Maruyama | 455/76 |
| 6,115,157 A | 9/2000 | Barnard et al. | 398/1 |
| 6,212,244 B1 | 4/2001 | Davidovici et al. | 375/345 |
| 6,473,598 B1 | 10/2002 | Sepehry-Fard | 455/76 |
| 6,498,927 B1 * | 12/2002 | Kang et al. | 455/245.2 |
| 6,549,766 B1 | 4/2003 | Vorenkamp et al. | 455/307 |
| 6,591,091 B1 | 7/2003 | Vorenkamp et al. | 455/179.1 |
| 6,728,514 B1 * | 4/2004 | Bandeira et al. | 455/13.1 |
| 2002/0094788 A1 * | 7/2002 | Hayashi et al. | 455/73 |

* cited by examiner

*Primary Examiner*—Joseph Feild
*Assistant Examiner*—Wayne Cai
(74) *Attorney, Agent, or Firm*—Miles & Stockbridge, PC

(57) ABSTRACT

Disclosed herein is a direct conversion type signal processing semiconductor integrated circuit device capable of suppressing a DC voltage variation in the output of a variable gain amplifier upon the transition to a reception mode, reproducing stable receiving characteristics and improving receiving sensitivity. In the signal processing semiconductor integrated circuit device, voltage reference circuits for generating reference voltages for controlling or restricting currents for current sources for supplying operating currents for amplifiers constituting a reception-system circuit are boosted upon the transition from an idle mode or the like to the reception mode to allow the currents to flow into the constant-current sources of the amplifiers after the stabilization of the generated reference voltages.

14 Claims, 10 Drawing Sheets

SIGNAL PROCESSING SEMICONDUCTOR INTEGRATED CIRCUIT DEVICE AND WIRELESS COMMUNICATION SYSTEM

BACKGROUND OF THE INVENTION

The present invention relates to a semiconductor integrated circuit technology and a technology effective for application to a reduction in DC offset of each of multistage-connected amplifiers, e.g., a technology effective for application to a direct conversion type signal processing LSI (Large Scale Integration) for processing transmit and receive signals used in a cellular telephone.

A system called a "superheterodyne system" has heretofore been known for a radio communication LSI for processing transmit and receive signals used in a cellular phone. Such a configuration as shown in FIG. 10 by way of example is considered as a reception-system circuit based on the superheterodyne system. Namely, as illustrated in FIG. 10, the reception-system circuit comprises a bandwidth limiting filter (FLT) 111 comprising a SAW filter which eliminates an unnecessary wave from a signal received by an antenna AT, a low noise amplifier (LNA) 112 which amplifies the signal having passed through the filter 111, a mixer (MIX) 113 which combines the amplified received signal with a local oscillation signal generated from an oscillation-system circuit 130 and thereby down-converts it to a signal having an intermediate frequency, a bandpass filter (BPF) 114 which allows a signal having a frequency equivalent to the difference in frequency between the received signal and the local oscillation signal to pass therethrough, a gain-controllable programmable gain amplifier (PGA) 115 which amplifies a signal to a desired level, a demodulator (DeMOD) 116 which demodulates a signal adjusted to a desired width into a baseband signal (I/Q) having a voice frequency, etc.

SUMMARY OF THE INVENTION

The superheterodyne system is accompanied by a problem that since the process of demodulating the received signal is done after the received signal is temporarily down-converted to the intermediate frequency signal, a circuit scale becomes large. Therefore, the present inventors have developed a signal processing LSI of a direct conversion system for directly down-converting a received signal to a baseband signal (I/Q) of a voice frequency to thereby effect demodulation thereof. However, the present inventors have found out defects or defective conditions in that in the direct conversion system, a DC voltage of an output of a variable gain amplifier for amplifying a demodulated signal varies with time after the circuit is boosted. Therefore, as a result of discussions on their causes, the following causes have been shown apparently.

Namely, in such a superheterodyne system as shown in FIG. 10, the portion from the low noise amplifier (LNA) to the previous stage of the demodulator 116 takes AC (Alternating Current) coupling which transfers the received signal through a capacitor. Therefore, no DC component is transferred in the case of the AC coupling even if a DC offset exists in the output of each amplifier due to a variation in voltage generated from a voltage reference circuit like a bandgap reference circuit for generating a reference voltage for the current source for allowing an operating current to flow into the amplifier in each stage. Therefore, since the DC offset of the previous stage does not exert an influence on the next-stage circuit, a variation in DC voltage of the output of the final-stage amplifier results in an extremely small one.

However, the receiving circuit of the direct conversion system has a configuration wherein the bandpass filter (BPF) 114 and the demodulator (DeMOD) 116 shown in FIG. 10 are omitted. The mixer (113) down-converts a receive signal like 900 MHz into a signal of a voice frequency (ranging from 0 kHZ to 70 kHZ) at one go and demodulates it.

Therefore, the mixer 113 and the variable gain amplifier 115 should unavoidably be DC (Direct-Current)—coupled to each other. When a DC offset occurs in the output of the mixer 113 due to the variation in reference voltage generated from the corresponding voltage reference circuit, the DC offset is amplified by the variable gain amplifier 115. Since the gain of the variable gain amplifier 115 exceeds 1500 times in total, the DC offset will be amplified greatly in the same manner as described above. As a result, it became apparent that the DC voltage of the output of the amplifier would vary. Incidentally, the DC offset occurs in the output of the mixer due to the variation in the reference voltage because variations occur in each differential transistor constituting the mixer. When the operating current for the mixer is varying, the DC offset is considered to vary correspondingly.

An object of the present invention is to enable a signal processing semiconductor integrated circuit device of a direct conversion system to suppress a variation in DC voltage of an output of a variable gain amplifier upon the transition to a reception mode, reproduce stable receiving characteristics and improve receiving sensitivity.

The above, other objects and novel features of the present invention will become apparent from the description of the present specification and the accompanying drawings.

Summaries of typical ones of the inventions disclosed in the present application will be described in brief as follows:

There is provided a signal processing semiconductor integrated circuit device, comprising a reception-system circuit including a first amplifier circuit which amplifies a received signal; frequency converting means which combines the amplified signal with an oscillation signal having a predetermined frequency to thereby effect frequency conversion on the combined signal; and a second amplifier circuit which is DC-coupled to the frequency converting means and amplifies the signal frequency-converted by the frequency converting means; the signal processing semiconductor integrated circuit device having a first operation mode in which the reception-system circuit is activated and a second operation mode in which the reception-system circuit is deactivated; wherein voltage reference circuits which respectively generates bias voltages for current sources for supplying operating currents for the frequency converting means and the second amplifier circuit, are activated in response to the transition from the second operation mode to the first operation mode, and thereafter the bias voltages are transferred to the current sources of the frequency converting means and the second amplifier circuit to thereby activate the frequency converting means and the second amplifier circuit.

More specifically, in the signal processing semiconductor integrated circuit device of the direct conversion system, voltage reference circuits for generating reference voltages for controlling or restricting currents for current sources for supplying operating currents for amplifiers constituting a reception-system circuit are boosted upon the transition from an idle mode or the like to the reception mode to allow the currents to flow into the constant-current sources of the amplifiers after the stabilization of the generated reference voltages.

According to the above means, a DC offset developed in each amplifier upon the transition from the first operation mode like the idle mode to the second operation mode like the reception mode is reduced, and a variation in DC voltage of an output of a variable gain amplifier at the transition to the second operation mode (reception mode) is suppressed, thereby making it possible to reproduce stable receiving characteristics and receiving sensitivity in a communication system.

Preferably, after the bias voltages have been transferred to the current sources of the frequency converting means and the second amplifier circuit, the second amplifier circuit performs a calibration for reducing a DC offset included in an output signal, and the first amplifier circuit is activated after the elapse of a predetermined time. By executing the calibration of the DC offset, the communication system can reproduce stabler receiving characteristics.

Further, when the second amplifier circuit comprises a plurality of amplifying stages, each of the amplifying stages is set or configured so as to perform a calibration for reducing a DC offset included in an output signal. Consequently, the DC-offset calibration high in accuracy can be achieved.

The voltage reference circuits are provided in plural form in association with each of the first amplifier circuit, the frequency converting means and the second amplifying circuit. Thus, the routing of wirings for supplying the reference currents is less reduced and the high-accuracy supply of reference currents is allowed.

Further, a third amplifier circuit (dummy LNA) is connected to the input side of the frequency converting means. After the voltage reference circuits are activated, bias voltages produced therefrom are transferred to their corresponding current sources of the third amplifier circuit, the frequency converting means and the second amplifier circuit, so that the second amplifier circuit performs a calibration for reducing a DC offset included in an output signal. Thus, the influence of noise brought round from the oscillation circuit through the first amplifier circuit upon normal operation can be provided upon calibration, and hence more accurate calibration for a DC offset can be carried out.

After the completion of the calibration by the second amplifier circuit, the transfer of the bias voltage to the current source of the third amplifier circuit is interrupted, and the transfer of the bias voltage to the current source of the first amplifier circuit is carried out. Thus, the amplifying operation of the normal amplifier circuit is started after the completion of the calibration, and the third amplifier circuit is activated upon the normal operation to avoid the exertion of a bad influence.

Further, a reception-system circuit having the above-described configuration, a transmission-system circuit including a modulation circuit which modulates a transmit signal, and frequency converting means which combines the modulated signal with an oscillation signal to thereby effect frequency conversion on the combined signal, a control-system circuit which controls the reception-system circuit and the transmission-system circuit, and an oscillation-system circuit which generates an oscillation signal or an oscillation control signal combined by the reception-system circuit and the transmission-system circuit, are formed on a single semiconductor substrate so as to constitute a signal processing semiconductor integrated circuit device. Thus, it is possible to implement a one-chip transmitting/receiving LSI, reduce the number of parts in a communication system, increase packing density and hence bring a cellular phone into less size.

There is provided a wireless communication system comprising a signal processing semiconductor integrated circuit device of the above one chip; and a baseband circuit brought into a semiconductor integrated circuit, which performs signal processing for performing the conversion of a signal outputted from the reception-system circuit to a voice signal and the conversion of the voice signal to the transmit signal, and controls the signal processing semiconductor integrated circuit device, wherein a command signal for activating the voltage reference circuit and a command signal for activating the frequency converting means and the second amplifier circuit are supplied from the baseband circuit to the signal processing semiconductor integrated circuit device. Thus, there is no need to provide a control LSI like a microprocessor, which controls the entire system separately from the baseband circuit. It is also possible to reduce the number of parts in the communication system, increase packing density and hence bring a cellular telephone into less size.

The command signal for activating the voltage reference circuit and the command signal for activating the frequency converting means and the second amplifier circuit may preferably be supplied from the baseband circuit to the control-system circuit lying within the signal processing semiconductor integrated circuit device. Thus, the baseband circuit may simply supply a command to the control-system circuit of the signal processing semiconductor integrated circuit device, and there is no need to directly supply a control signal from the baseband circuit to each circuit lying inside the signal processing semiconductor integrated circuit device. It is therefore possible to reduce the number of signal lines between the baseband circuit and the signal processing semiconductor integrated circuit device and reduce the number of external terminals in the respective circuits Further, another invention of the present application provides a method of controlling a signal processing semiconductor integrated circuit device which comprises a reception-system circuit including a first amplifier circuit which amplifies a received signal; frequency converting means which combines the amplified signal with an oscillation signal having a predetermined frequency to thereby effect frequency conversion on the combined signal; and a second amplifier circuit which is DC-coupled to the frequency converting means and amplifies the signal frequency-converted by the frequency converting means, and which has a first operation mode in which the reception-system circuit is activated and a second operation mode in which the reception-system circuit is deactivated, the method comprising the steps of activating voltage reference circuits which respectively generate bias voltages for current sources for supplying operating currents for the frequency converting means and the second amplifier circuit, in response to the transition from the second operation mode to the first operation mode; and after the elapse of a predetermined time, transferring the bias voltages to the current sources of the frequency converting means and the second amplifier circuit to thereby activate the frequency converting means and the second amplifier circuit respectively.

Owing to the adoption of such a control method, the signal processing semiconductor integrated circuit device having the first operation mode for activating the reception-system circuit and the second operation mode for deactivating the reception-system circuit is capable of reducing a DC offset developed in each amplifier upon the transition from the first operation mode like an idle mode to the second operation mode like a reception mode and suppressing a variation in DC voltage included in an output of a variable gain amplifier upon the transition to the second operation mode (reception mode). A communication system is capable of reproducing stable receiving characteristics and increasing receiving sensitivity.

DETAILED DESCRIPTION OF THE INVENTION

Preferred embodiments of the present invention will hereinafter be described with reference to the accompanying drawings.

Figure 1:
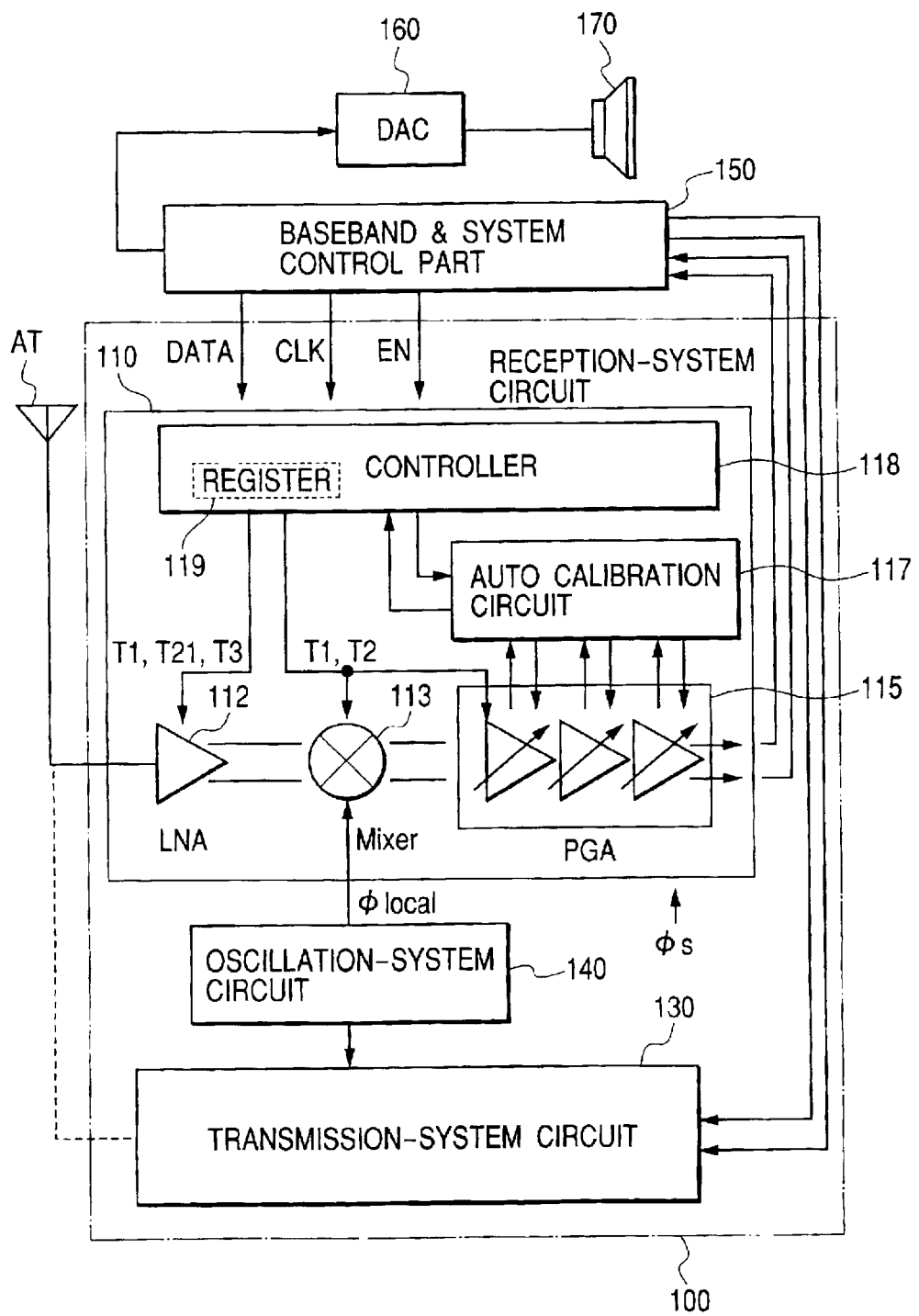
FIG. 1 is a configurational view showing an embodiment of a signal processing system for a cellular telephone, which is suitable for application of the present invention thereto.

FIG. 1 shows a configurational example of a signal processing system for a cellular telephone, which is suitable for application of the present invention thereto.

In FIG. 1, AT indicates an antenna which transmits a signal wave therefrom and receives it therein. Reference numeral 110 indicates a direct conversion reception-system circuit which demodulates and amplifies the signal received by the antenna AT without intervention of an intermediate frequency and converts it to a baseband signal, reference numeral 130 indicates a transmission-system circuit which modulates and frequency-converts the baseband signal to be transmitted via the antenna AT, reference numeral 140 indicates an oscillation-system circuit which generates a local oscillation signal φlocal necessary for the frequency conversion at each of the reception-system circuit 110 and the transmission-system circuit 130, and reference numeral 150 indicates a baseband & system control unit or part which performs signal processing such as the conversion of a receive baseband signal to an audio or voice signal, the conversion of an audio signal to a baseband signal, etc., and carried out control on the reception-system circuit 110 and the transmission-system circuit 130, respectively. A D/A converter 160 converts audio or voice data outputted from the baseband & system control part 150 into analog form, which is supplied to a speaker 170 from which the voice is reproduced.

The reception-system circuit 110 comprises a low noise amplifier (LNA) or low noise amplifier unit 112 which amplifies a signal received by the antenna AT, a mixer (MIX) 113 which combines the amplified received signal with a local oscillation signal whose frequency is divided into the same frequency as the received signal, into one and thereby directly down-converts it into a voice frequency baseband signal and demodulates it, a high-gain PGA unit 115 which has gain controllable programmable gain amplifiers (PGA) and low-pass filters (LPF) provided in plural stages and amplifies signals to predetermined levels respectively, an auto calibration circuit 117 which effects DC offset calibration of the PGA unit 115, a controller 118 which effects operational control on the reception-system circuit 110 and the transmission-system circuit 130, based on a command and the like outputted from the baseband & system control part 150.

A serial bus, which comprises three signal lines, connects between the baseband & system control part 150 and the controller 118 lying in the reception system. The baseband & system control part 150 supplies command code DATA, a clock CLK for giving timing provided to latch a command thereof, and an enable signal EN indicative of data being effective, to the controller 118 lying in the reception system. Thus, the controller 118 effects operational control on the reception-system circuit 110 based on the command supplied thereto.

Although not shown in FIG. 1, a SAW filter for eliminating an unnecessary wave from the signal received by the antenna AT is provided in a stage preceding the low noise amplifier (LNA) unit 112. In the present embodiment, although not restricted in particular, the reception-system circuit 110, the transmission-system circuit 130 and the oscillation-system circuit 140 are formed on one semiconductor substrate like, for example, monocrystalline silicon as a semiconductor integrated circuit device 100 except for the SAW filter, filter capacitor, etc. While the baseband & system control part 150 per se is also configured as one semiconductor integrated circuit device, a baseband circuit and a system control circuit may be configured as discrete semiconductor integrated circuit devices.

Figure 2:
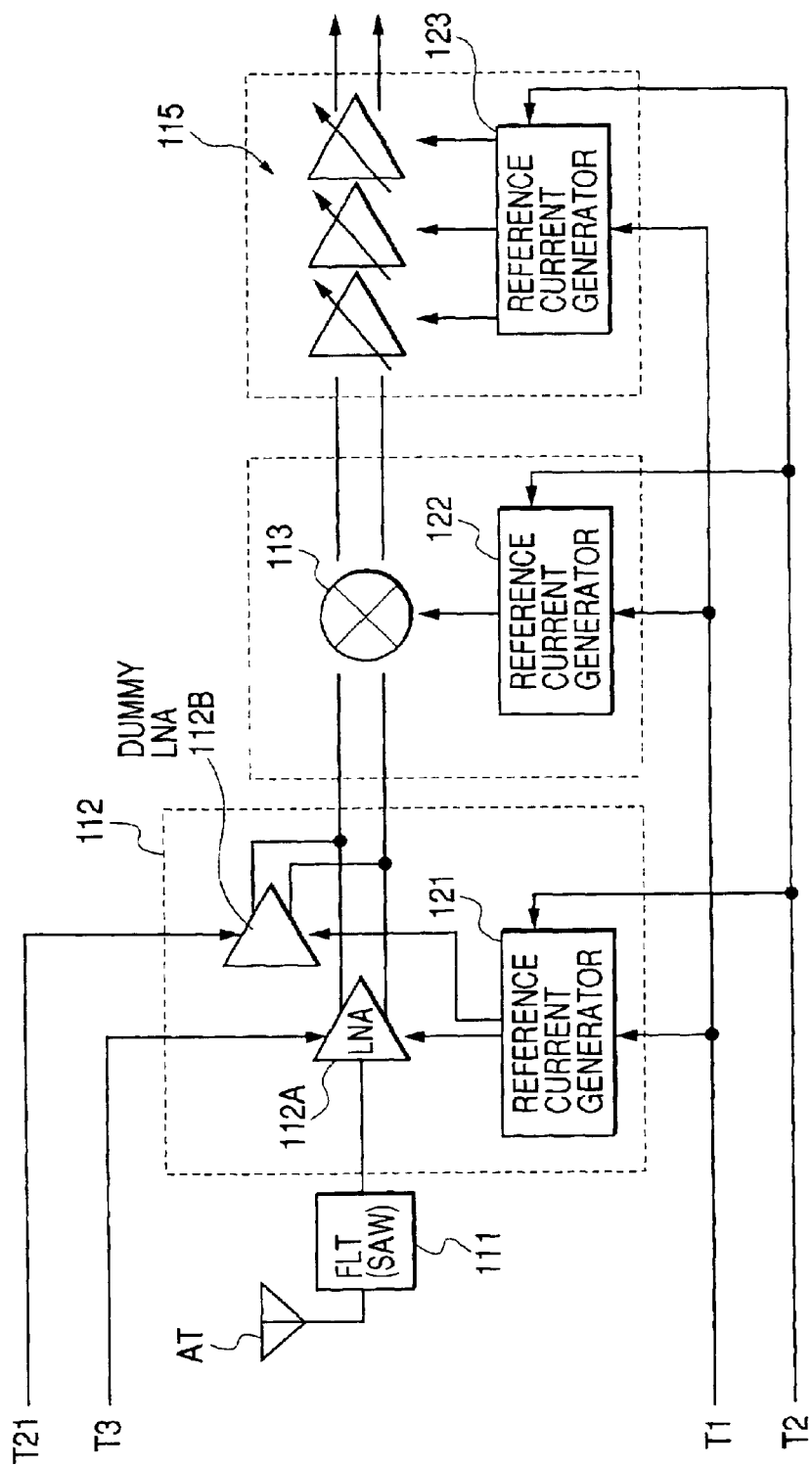
FIG. 2 is a block diagram illustrating a detailed example of a drive system of a signal receiving unit of a reception-system circuit 110.
Figure 3:
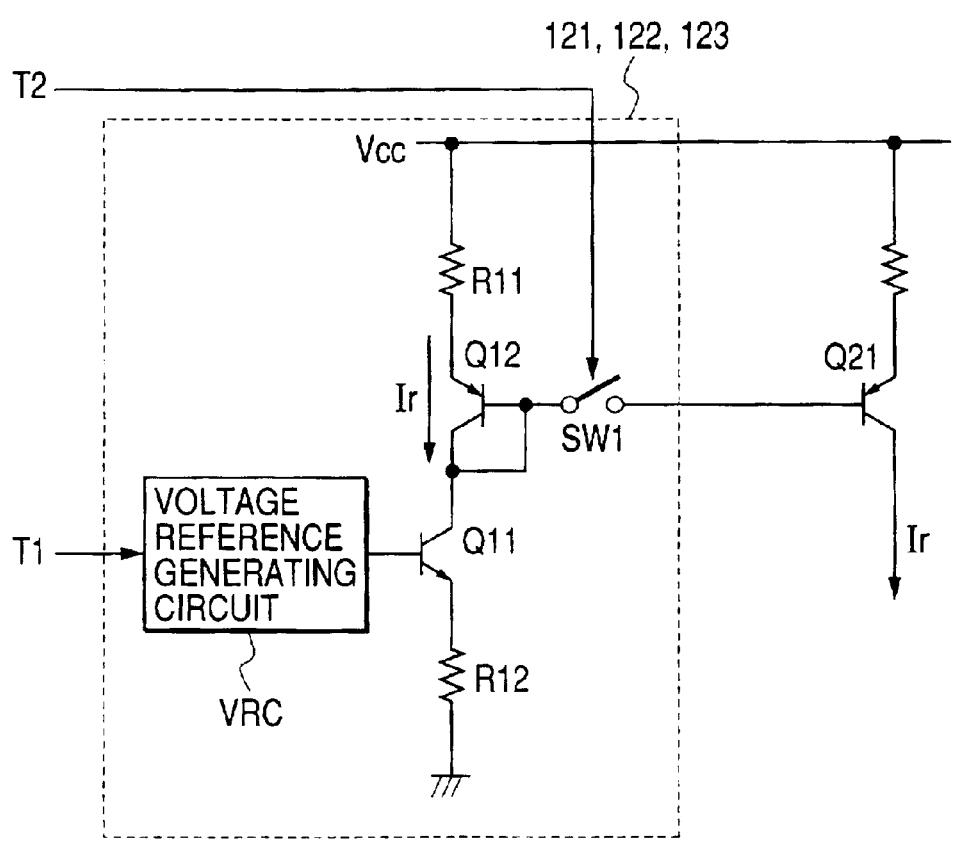
FIG. 3 is a configurational view showing one example of a reference current generator shown in FIG. 2.

FIG. 2 shows a more specific configuration of the reception-system circuit 110, and FIG. 3 illustrates an example of a specific circuit configuration of a reference current generator for supplying an operating current to each of amplifiers in respective stages which constitute the reception-system circuit.

In the present embodiment, the LNA unit 112 is provided with an original low noise amplifier 112A and a dummy LNA 112B having the same circuit configuration as that. The PGA unit 115 is provided with three programmable gain amplifiers PGA1, PGA2 and PGA3 and are connected in tandem with filters being respectively interposed therebetween as will be described later. The low noise amplifier 112A and the dummy LNA 112B, the mixer 113, and the programmable gain amplifiers PGA1 through PGA3 are respectively provided with reference current generators 121, 122 and 123 which respectively generate reference currents necessary to cause operating currents to flow through their corresponding amplifiers.

As shown in FIG. 3, each of the reference current generators 121 through 123 comprises a voltage reference circuit VRC like a bandgap reference circuit, a bipolar transistor Q11 which receives a generated reference voltage Vref at its base, a resistor R11 connected between a source voltage Vcc and the collector of the transistor Q11, a current mirror transistor Q12 whose base and collector are coupled thereto, and a resistor R12 connected between the emitter of the transistor Q11 and a ground. A circuit, which comprises the resistors R11 and R12 and the transistors Q11 and Q12, serves as a voltage-current converting circuit.

The base terminal of the transistor Q12 and a base terminal of a transistor Q21 provided as a constant current source for the amplifier in each stage are connected to each other to constitute a current mirror circuit, whereby the same currents as the reference currents Ir of the reference current generators 121 through 123 are allowed to flow in the constant current sources for the amplifiers in the respective stages.

A switch SW1 for determining whether the voltage applied to the base of the transistor Q12 of the voltage-current converting circuit should be transferred, is provided between each of the reference current generators 121, 122 and 123 and the transistor Q21 used as the current source which causes the operating current to flow through the amplifier in each stage. The switch SW1 is configured so as to be controlled by a control signal T2 outputted from the controller 118. In the LNA unit 112, however, the reference current generator 121 corresponding to the low noise amplifier 112A and the dummy LNA 112B is configured so as to carry the reference current to either one of the low-noise amplifier 112A and the dummy LNA 112B according to the selection of switches provided for the low-noise amplifier 112A and the dummy LNA 112B as will be described in detail later.

Further, the voltage reference circuit VRC in each of the reference current generators 121 through 123 is configured so as to be capable of being switched to an active state or an inactive state according to a control signal T1 outputted from the controller 118 in order to reduce current consumption when the system is brought to an idle mode so that the reception-system circuit 110 is deactivated, for example.

In the reception-system circuit employed in the present embodiment, the voltage reference circuit VRC is first activated based on the control signal T1, and the switch SW1 is turned ON after the stabilization of its reference voltage to cause a current to flow into the current source for the amplifier in each stage, whereby a variation in DC offset is prevented. Incidentally, the low noise amplifier 112A and the mixer 113 are AC-connected with a capacitor interposed therebetween as to the LNA unit 112, a variation in DC offset of the low noise amplifier 112A incident to a variation in reference voltage is not transferred to the mixer 113. Accordingly, the switch SW1 on the output side of the reference current generator 121 corresponding to the low noise amplifier 112A may be omitted.

On the other hand, the controller 118 of the reception-system circuit 110 comprises a register 119 which stores therein command codes, etc. outputted from the baseband & system control part 150, a decoder circuit which outputs a control signal to each internal circuit, based on the corresponding value stored in the register 119, a logic circuit which generates a control signal having predetermined timing, based on a command supplied from the baseband & system control part 150 and a signal indicative of a calibration end or completion notification outputted from the auto calibration circuit 117, etc.

Further, the controller 118 generates and outputs the control signal T1 for activating the voltage reference circuits VRC for the low noise amplifier 112A, and the dummy LNA 112B, mixer 113 and PGA unit 115 to be described later, the control signal T2 for supplying the reference currents generated from the reference current generators 121 through 123 to their corresponding amplifiers, an auto calibration control signal T21 for activating the dummy LNA 112B to enable auto calibration, and a reception control signal T3 for activating the low noise amplifier 112A so as to receive a signal therein, under predetermined conditions and with predetermined timings.

Figure 4:
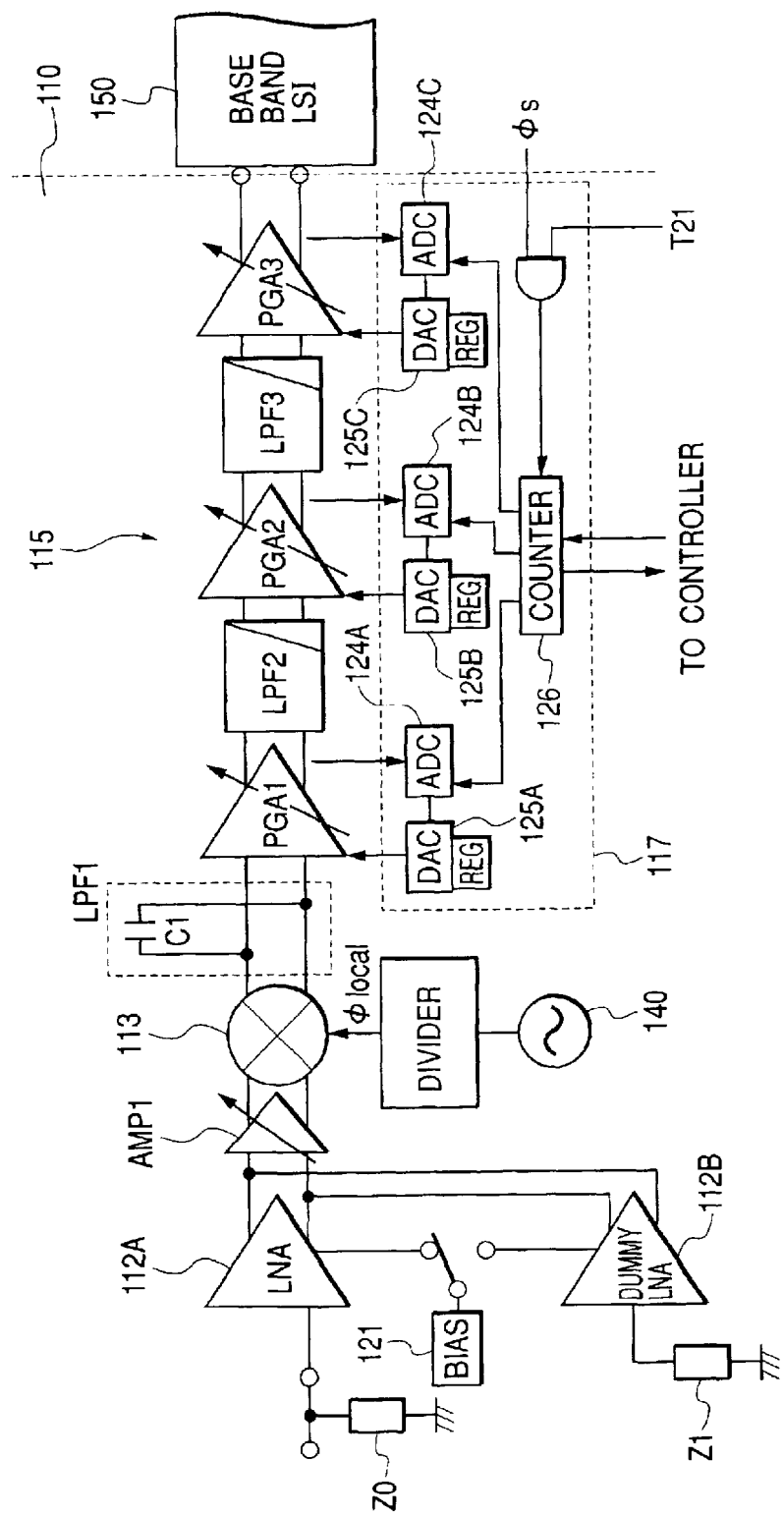
FIG. 4 is a block diagram illustrating a detailed example of a signal receiving unit including an auto calibration circuit 117.

FIG. 4 shows a more detailed configuration of the reception-system circuit 110.

As shown in FIG. 4, the PGA unit 115 comprises low-pass filters LPF1 through LPF3 which respectively cut high-frequency noise, and programmable gain amplifiers PGA1 through PGA3 capable of controlling gain, all of which are alternately connected in tandem. In the low-pass filters LPF1 through LP3, the second stage rather than the first stage, and the third stage rather than the second stage are respectively designed so that the inclinations of gain characteristic curves in the vicinity of their cut-off frequencies become steep.

Incidentally, the low-pass filter LPF1 corresponding to the first stage comprises a load on the output side of a mixer 113 and an external capacitive element Cl. Since the capacitive element Cl is relatively large in capacitance (e.g., 2200 pF), it is used as an external element. The low-pass filter LPF2 corresponding to the second stage serves as a secondary filter, and the low-pass filter LPF3 corresponding to the third stage serves as a tertiary filter. Since capacitive elements that constitute these filters, are relatively small in capacitance value, they are formed on a semiconductor substrate together with elements which constitute each amplifier.

The programmable gain amplifiers PGA1 through PGA3 are designed so as to be capable of obtaining high gain like, for example, 1600 times in three stages. Since signals subsequent to the mixer 113 take or correspond to signals lying in a baseband zone ranging from 0 Hz to 70 kHz in a direct conversion system, the circuits subsequent to the mixer 113, such as the low-pass filters LPF1 through LPF3 and the programmable gain amplifiers PGA1 through PGA3 cannot be capacitively-coupled to one another and hence they are DC-coupled to one another.

The auto calibration circuit 117 is provided so as to correspond to each of the programmable gain amplifiers PGA1 through PGA3 and comprises AD converters 124A through 124C which respectively convert potential differences outputted from the programmable gain amplifiers PGA1 through PGA3 into their corresponding digital signals, DA converters 125A through 125C which respectively give such input offsets that DC offsets of outputs are brought to "0", to differential inputs of the corresponding programmable gain amplifiers PGA1 through PGA3, based on the results of comparisons by the AD converters 124A through 124C, a counter 126 which gives operating timings to the respective AD converters 125A through 125C, etc.

When the auto calibration circuit 117 starts calibration according to a command issued from the controller 118, it firstly performs a DC offset calibration of the programmable gain amplifier PGA1 corresponding to the first stage and carries out calibration in order stage by stage as in the case where after the first stage is calibrated, the second stage is next subjected to calibration, and after the calibration of the second stage, the third stage is next subjected to calibration.

Although not restricted in particular, the DC offset calibration of each stage adopts a method of successive approximation in which the comparison of differential outputs of the amplifiers by the AD converters 124A through 124C and the application of voltages to the amplifiers by the DA converters 125A through 125C are repeatedly performed. The DA converters 125A through 125C combine n types (where n: positive integer, e.g., a value like 6) weighting currents placed in such a relation that, for example, current values are i, 2i, 4i, 8i . . . , according to n-bit input signals and convert the same into their corresponding voltages. Thus, the DA converters 125A through 125C are capable of respectively selecting ones from voltage values represented in $2^n$ stages and outputting the same therefrom.

Further, the comparison between the outputs of the amplifiers in the AD converters 124A through 124C according to the timing signals outputted from the counter 126 and their corresponding reference voltages, and the application of the voltages to the differential amplifier inputs by the DA converters 125A through 125C according to the result of their AD conversions are repeatedly performed six times, for example, so that the calibrations of the programmable gain amplifiers PGA1 through PGA3 in the respective stages are respectively executed. After the completion of their calibrations, the final DA input values necessary to bring the DC offsets of the respective amplifiers to "0" are stored in their corresponding registers REG provided for the DA converters 125A through 125C and controlled so as to hold such states till the next calibration or the completion of a reception mode.

As to the calibration operations, the counter 126 counts a system clock φs, based on the control signal outputted from the controller 118 to successively generate timing signals for the AD converter 124A corresponding to the first stage and the AD converters 124B and 124C corresponding to the second and third stages and output the same to the AD converters, thereby executing the DC offset calibrations of the amplifiers in the respective stages in their turn. When each of the DC offset calibrations is completed, the counter 126 outputs a signal indicative of the completion thereof to the controller 118.

Incidentally, although not restricted in particular in the present embodiment, the second-stage amplifier PGA2 and the third-stage amplifier PGA3 are respectively configured so as to be capable of adjusting input offsets with resistors attached to their input terminals. In this condition, they vary the input offsets so that the DC offsets are brought to "0" in view of their output voltages, whereas the first-stage amplifier PGA1 is adjusts the output so that the DC offset is brought to "0" in view of its output voltage.

Figure 5:
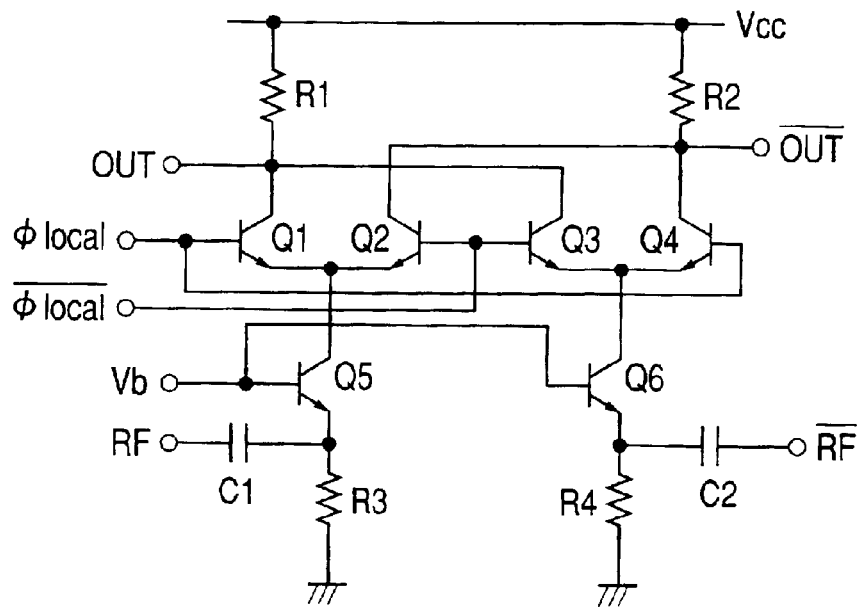
FIG. 5 is a circuit diagram depicting a circuit example of a mixer 113.

FIG. 5 shows a circuit example of the mixer 113. The mixer 113 employed in the present embodiment comprises two pairs of differential input transistors Q1 and Q2, and Q3 and Q4 whose emitters are connected in common, whose bases are inputted with differential local oscillation signals φlocal and/φlocal and whose one collectors are cross-coupled, resistors R1 and R2 respectively connected between the collector of Q1 and the collector of Q4 and a source voltage Vcc, a constant-current transistor Q5 and its emitter resistor R3 connected between the common emitters of Q1 and Q2 and the ground, and a constant-current transistor Q6 and its emitter resistor R4 connected between the common emitters of Q3 and Q4 and the ground. Differential receive signals RF and/RF are respectively inputted to the emitters of the constant-current transistors Q5 and Q6 and connecting nodes of the resistors R3 and R4 through capacitors C1 and C2. Further, frequency signals obtained by combining φlocal,/φlocal, RF and/RF together are differentially outputted from the collectors of the differential input transistors Q1 and Q4.

Figure 6:
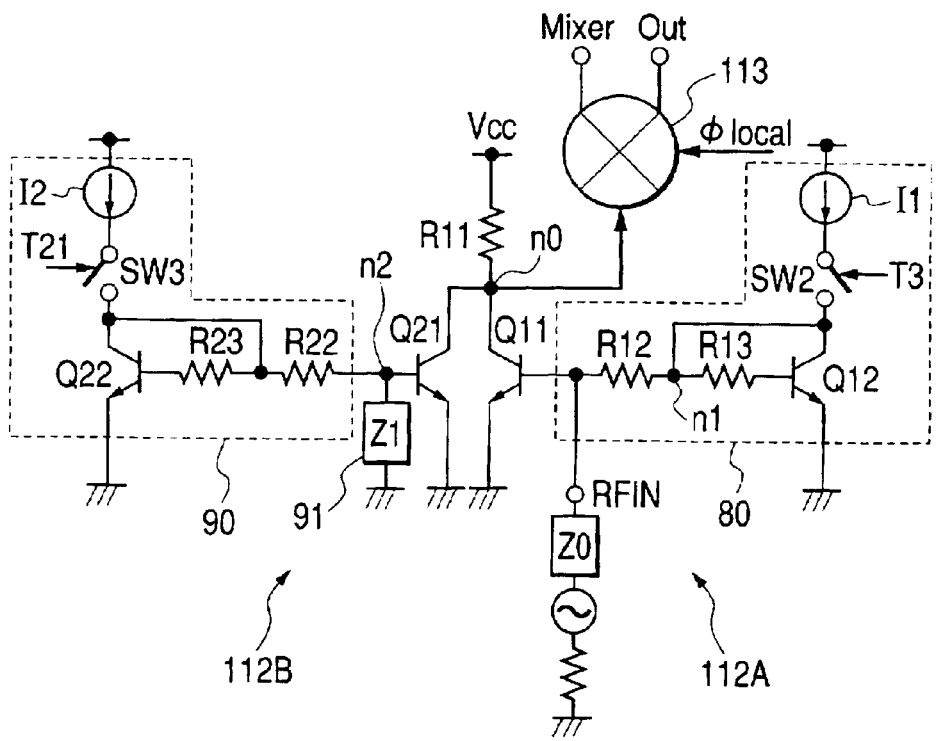
FIG. 6 is a circuit diagram showing a detailed example illustrative of an LNA 112A and a dummy LNA 112B.

FIG. 6 shows a circuit example illustrative of the low noise amplifier 112A and dummy LNA 112B provided at the input portion of the reception-system circuit 110. As described above, the dummy LNA 112B is a circuit configured as the same circuit by using elements identical in characteristic to the low noise amplifier 112A.

As shown in FIG. 6, the low noise amplifier 112A comprises a grounded-emitter amplifier circuit comprising a resistor R11 and a bipolar transistor Q11 seriesconnected between a source voltage Vcc and a ground, and a bias circuit 80 which includes both a transistor Q12 having a base commonly connected to the bipolar transistor Q11 and constituting a current mirror circuit, and a constant current source I1 connected in series with the bipolar transistor Q12, and which allows a bias current to flow through the bipolar transistor Q11. In the bias circuit 80, a switch SW2 capable of interrupting a current supplied from the constant current source I1 is provided between the constant current source I1 and the transistor Q12.

In the bias circuit 80, a base terminal of the transistor Q12 is connected to its corresponding base of the transistor Q11 through resistors R12 and R13. Further, the collector of the transistor Q12 is connected to a connecting node n1 placed between the resistors R12 and R13. Thus, the transistors Q11 and Q12 constitute a current mirror. In addition, the base terminal of the transistor Q11 is connected to an external input terminal RFIN to which a signal received by the antenna AT is inputted.

In the low noise amplifier 112A configured in this way, when the received signal is inputted to the base terminal of the transistor Q11 through the input terminal RFIN in a state in which the bias circuit 80 has allowed a collector current to flow through the transistor Q11, an amplified signal of the received signal appears at a connecting node n0 provided between the transistor Q11 and the resistor R11. This is supplied to the mixer 113. When the switch SW2 is turned off by the control signal T3 supplied from the controller 118 to interrupt the current, no collector current flows through the transistor Q11 either and hence the potential at the base thereof is reduced to a ground potential. Therefore, the transistor Q11 cannot be driven under the small received signal, and hence the low noise amplifier 112A is brought to an inactive state.

The dummy LNA 112B is configured in the form of the same circuit as the low noise amplifier 112A by using the same elements as that. Described specifically, the dummy LNA 112B comprises a dummy input transistor Q21 provided in parallel with the transistor Q11 so that the resistor R11 serves as a common load, and a bias circuit 90 including a transistor Q22 current-mirror connected to the transistor Q21, resistors R22 and R23 placed between the bases of the transistors Q21 and Q22, a switch SW3 connected to the collector side of Q22, and a constant-current source I2, and having the same configuration as the bias circuit 80 on the low noise amplifier 112A side. However, the switch SW3 provided in the dummy LNA 112B is controlled so as to be turned ON complementarily to the switch SW2 of the normal low noise amplifier 112A according to the control signal T21 outputted from the controller 118 upon execution of the calibration, i.e., when the SW2 is turned OFF, and to be turned OFF when the switch SW2 is turned ON.

A matching circuit 91 having an impedance Z1 substantially equivalent to an impedance Z0 of a circuit comprising an inductor and a capacitor externally attached to the input terminal RFIN is connected to a node n2 of the dummy LNA112B corresponding to the input terminal RFIN of the low noise amplifier 112A in such a manner that the impedance connected to the base of the transistor Q21 becomes equal to the impedance connected to the base of the transistor Q11. Incidentally, since it is difficult to form the inductor on a semiconductor substrate, the equivalent impedance Z1 is designed so that an impedance Z1 substantially equivalent to a frequency ωin of a signal received at the input terminal RFIN and brought to an internal circuit is obtained according to a combination of a resistor and a capacitor.

Further, the low noise amplifier 112A is generally formed in an area separated from the oscillation-system circuit 140 and the mixer 113 on the semiconductor substrate to make it hard to input leakage noise of the local oscillator. However, the dummy LNA 112B may also be formed in an area similar to the above.

Incidentally, the configurations of the low noise amplifier 112A and dummy LNA 112B and the configurations of their peripheral circuits are not limited to such configuration as shown in FIG. 6. For instance, a gain variable amplifier AMP1 (see FIG. 4) capable of switching gain to two stages is provided between the low noise amplifier 112A and the mixer 113. When a received signal is large in amplitude, the gain of the gain variable amplifier AMP1 may be switched to the low gain under the control of the baseband & system control part 150, whereas when the received signal is small in amplitude, the gain of the gain variable amplifier AMP1 may be switched to the high gain under the control of the baseband & system control part 150.

Figure 7:
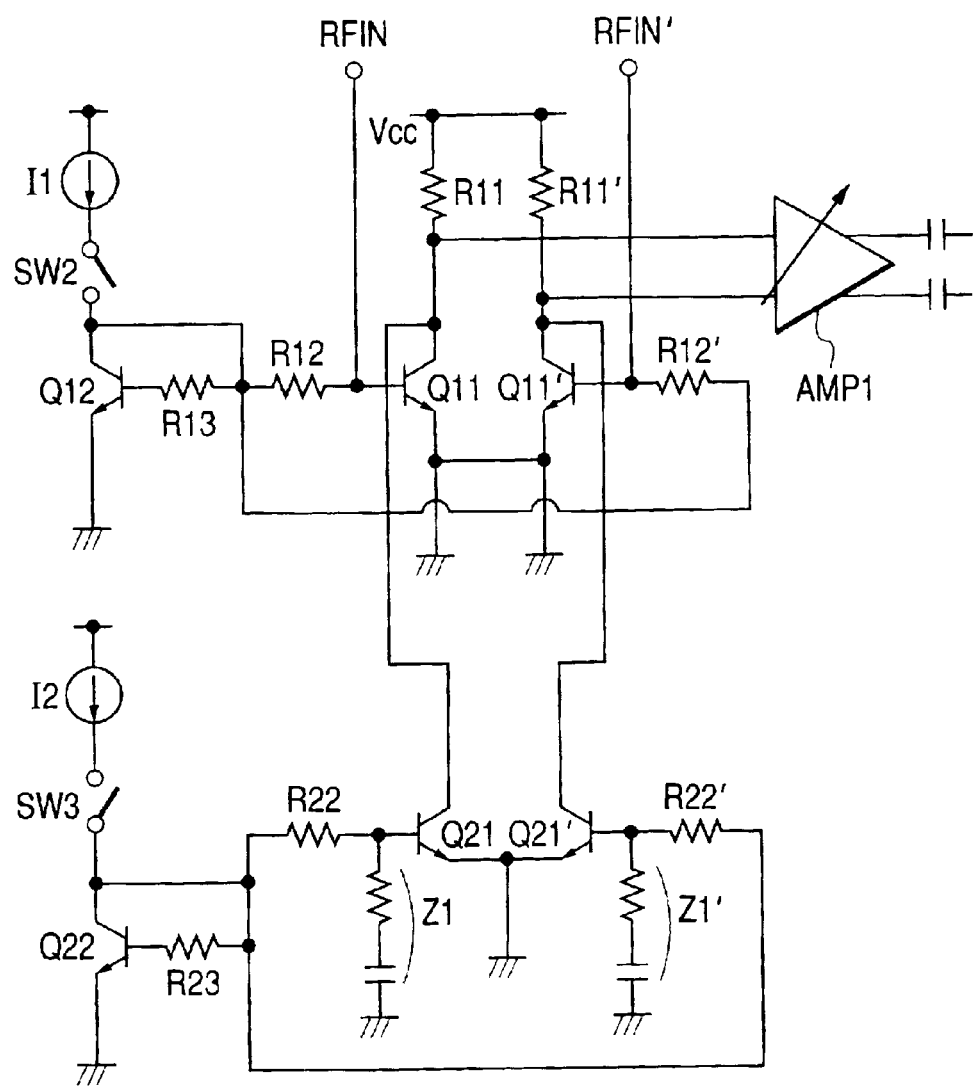
FIG. 7 is a circuit diagram illustrating one examples of a differential LNA 112A and a dummy LNA 112B.

The low noise amplifier 112A is configured as a differential type and may take such a configuration that a signal received by the antenna AT is converted to a differential signal, followed by inputting to a low noise amplifier. FIG. 7 shows a configurational example illustrative of a differential type low noise amplifier 112A and dummy LNA 112B applicable to such an embodiment. Incidentally, the circuit shown in FIG. 7 is one of a type wherein the circuit shown in FIG. 6 is configured as a differential type. Since the circuit shown in FIG. 7 is identical to the circuit shown in FIG. 6 in basic configuration and operation, their detailed description will be omitted. Although not restricted in particular in the embodiment of FIG. 7, the emitters of input transistors Q11 and Q11' of the low noise amplifier 112A are connected to their corresponding ground pins provided as external terminals. It is thus possible to reduce noise developed around each ground line. On the other hand, the emitters of input transistors Q21 and Q21' of the dummy LNA 112B are connected to their corresponding ground lines lying inside a chip.

Figure 8:
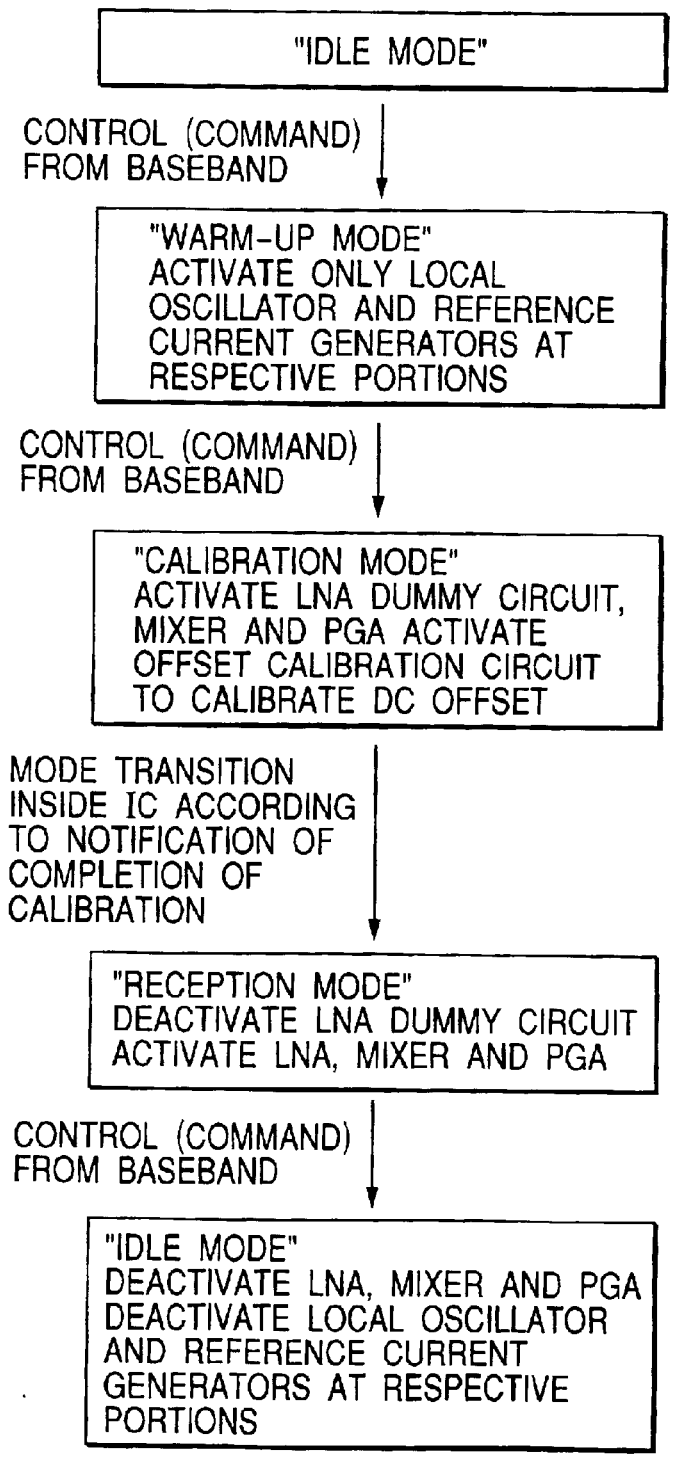
FIG. 8 is a flowchart showing a processing procedure used for switching between an idle mode and a reception mode of a signal receiving unit.
Figure 9:
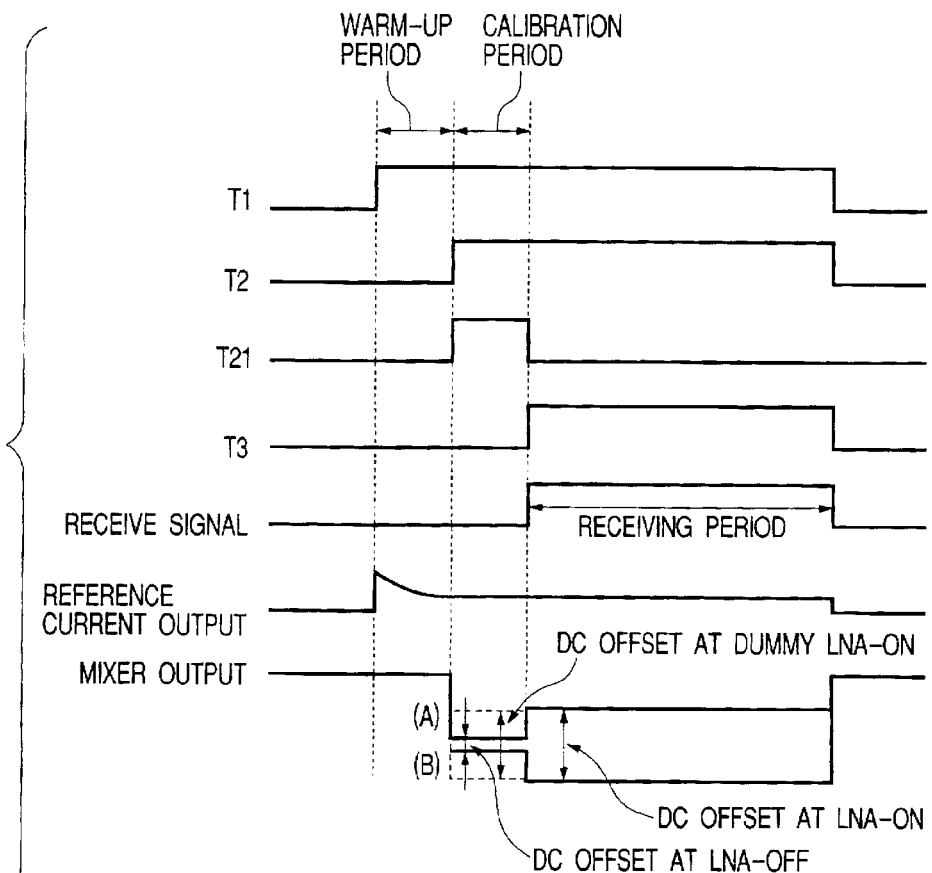
FIG. 9 is a timing chart illustrating operating waveforms developed upon switching between the idle mode and the reception mode of the signal receiving unit.
Figure 10:
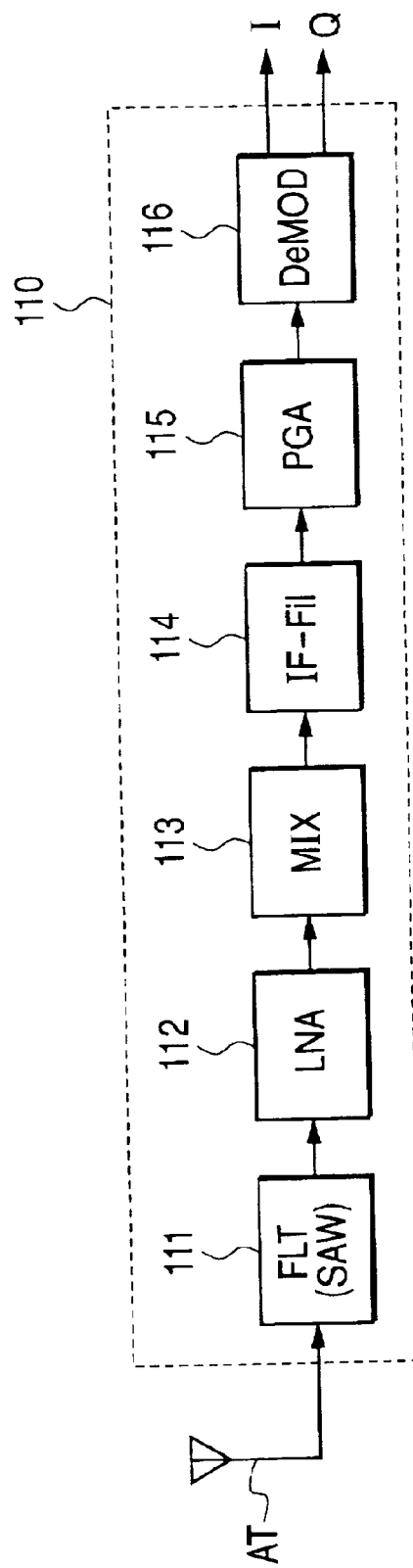
FIG. 10 is a block diagram showing an example of a configuration considered as a superheterodyne reception-system circuit employed in a cellular telephone.

A description will next be made of an offset calibration operation using the dummy LNA 112B. FIG. 8 is a flowchart showing a process for performing switching from an idle mode (standby mode) to a reception mode, and FIG. 9 shows a timing chart illustrating operations at switching from the idle mode to the reception mode, respectively.

The switching from the idle mode to the reception mode is made upon such an intermittent reception that a signal sent from a base station is received every predetermined intervals, in order to confirm in which radio zones of base stations a cellular phone is located when the cellular phone is in a standby state, for example. A baseband circuit starts a process for performing mode switching from the idle mode to the reception mode for each predetermined interval set in advance.

When predetermined timing is provided and the baseband circuit 150 starts a process for performing mode switching to the reception mode, the baseband circuit 150 first outputs a command code (warmup command) for starting the oscillating operation of the oscillation-system circuit 140 and activating the voltage reference circuits VRC of the reference current generators at the respective portions of the reception-system circuit 110, to the controller 118.

Under the control of the command outputted from the baseband circuit 150, the local oscillator of the oscillation-system circuit 140 starts an oscillating operation. On the other hand, a control signal T1 outputted from the controller 118 is changed to a high level in the reception-system circuit 110 so that the voltage reference circuit VRC of the reference current generator at each portion of the reception-system circuit 110 is made active. At this time, the reference current generator needs a predetermined time corresponding to the device characteristic of each transistor until a current is stabilized from its rising edge. Described specifically, as shown in FIG. 9, a current larger than a current at a steady time is outputted immediately after the rising operation of each reference current generator, and thereafter the current gradually approaches a predetermined steady-state current.

After the baseband circuit 150 has outputted a command code for activating the voltage reference circuit VRC of each reference current generator, the baseband circuit 150 transmits a command code for activating the mixer 113 and the PGA unit 115 to execute each DC offset calibration of the PGA unit 115, to the controller 118 of the reception-system circuit 110 with timing provided to count a predetermined period by its internal counter or the like.

When the command code is sent to the controller 118 of the reception-system circuit 110, the controller 118 thereof decodes the command code and substantially simultaneously outputs a control signal T2 for activating the mixer 113 and the PGA unit 115 and an auto calibration mode signal T21. The control signal T2 is supplied to the switches SW1 on the output sides of the reference current generators respectively provided in the mixer 113 and the PGA unit 115. When each of the switches SW1 is brought to an ON state, the same current as the reference current generated based on the previous control signal T1 is allowed to flow into each of current sources for the mixer 113 and the PGA unit 115 according to the operation of the current mirror circuit, so that the mixer 113 and the PGA unit 115 are made active.

On the other hand, the auto calibration mode signal T21 is supplied to its corresponding switch SW3 provided in a path for supplying an operating current to the dummy LNA 112B, so that the switch SW3 is brought to an ON state to activate the dummy LNA 112B. At the same time the auto calibration mode signal T21 is inputted to the auto calibration circuit 117. Thus, the counter 126 provided inside the same circuit is operated to start an auto calibration process, whereby auto calibrations at the PGA unit 115 are performed in a state in which the dummy LNA 112B is active.

Figure 11:
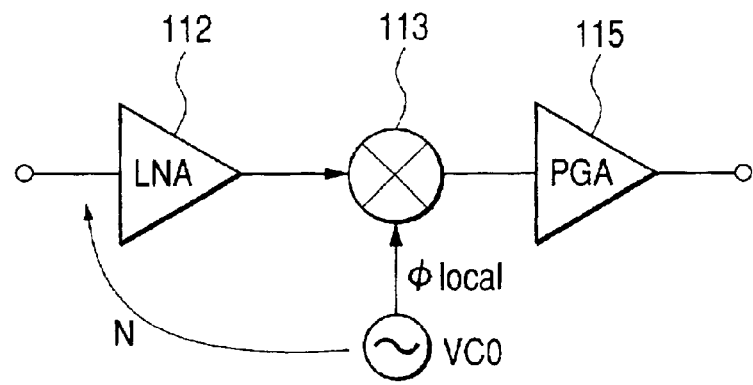
FIG. 11 is a reference diagram for describing a self-mixing operation incident to leakage noise of a local oscillation signal employed in a reception-system circuit of a direct conversion system.
Figure 12:
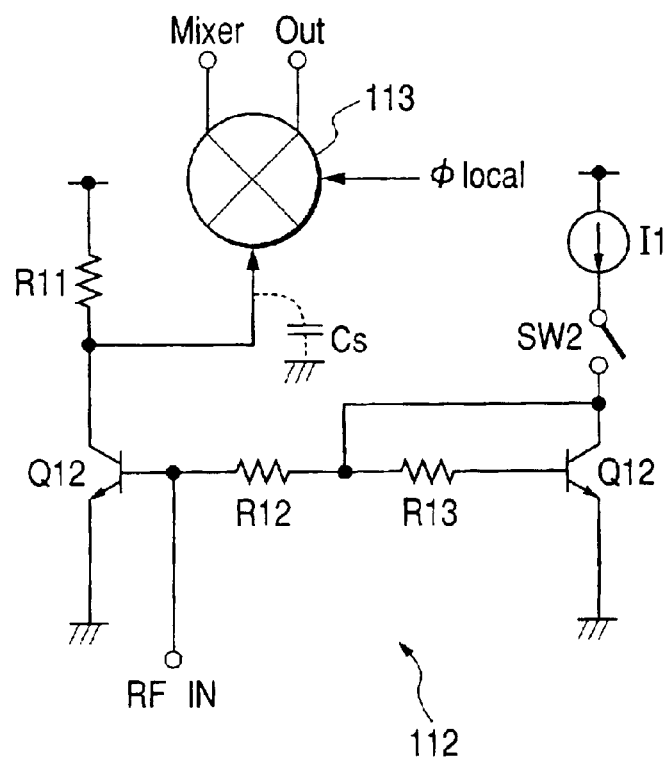
FIG. 12 is a circuit diagram showing one example of a low noise amplifier (LNA).

The impedance on the input side of a mixer 113 in such a low noise amplifier as shown in FIGS. 12 and 11 free of the provision of the dummy LNA 112B can be regarded as a parallel connection of a resistor R11 and a parasitic capacity Cs on the input terminal side of the mixer. Leakage nose of a local oscillation signal is considered to be mixed through the impedance on the input terminal side of the mixer. The resistor R11 of the impedance on the input terminal side is not varied in ON and OFF states of the low noise amplifier 112A. Since, however, the parasitic capacity Cs is extremely different in its charge and discharge currents in the ON and OFF states, the impedance greatly varies.

Therefore, since the impedance on the input side of the mixer 113 is low in a state in which the switch SW2 is turned OFF to avoid the influence of a disturbing wave from the antenna to thereby interrupt a current of the low noise amplifier 112A, the influence of the leakage noise of the local oscillation signal is small and the output of the mixer 113 takes such a value that a DC offset is substantially near "0" as indicated by a solid line in FIG. 9. Thus, the amount of calibration of the DC offset by the auto calibration is also slight. When the low noise amplifier 112A is thereafter turned ON, the parasitic capacity Cs on the input terminal side of the mixer increases so that the leakage noise of the local oscillation signal is easy to mix. Due to its influence, the DC offset in the output of the mixer 113 is suddenly enlarged. Thus, when the dummy LNA 112B is not provided or when the dummy LNA 112B is turned OFF even under the presence of the dummy LNA, the DC offset cannot be corrected even if the calibration is carried out.

Thus, since the auto calibration is carried out in the turned-ON state of the dummy LNA 112B in the present embodiment, the DC offset appears in the output of the mixer 113 as indicated by a broke line in FIG. 9 with the same magnitude as at the normal receiving operation in which the low noise amplifier 112A is being turned ON, even if the low noise amplifier 112A is turned OFF with the turning ON of the dummy LNA 112B. Since the auto calibration is carried out to correct the DC offset, the DC offset can greatly be corrected or calibrated as compared with the case where the dummy LNA 112B is not provided. Incidentally, when the PGA unit 115 is configured in three stages as in the embodiment of FIG. 4, the first-stage gain variable amplifier PGA1 principally performs the calibration of the DC offset due to the influence of the leakage noise of the local oscillation signal, and each of the subsequent-stage gain variable amplifiers PGA2 and PGA3 per se performs auto calibration for correcting each DC offset due to device variations in each amplifier per se.

When the calibration operation by the auto calibration circuit 117 is completed in the above-described manner, the final DA input values necessary to bring the DC offsets of the respective amplifiers to "0" are held in their corresponding registers REG provided in the DA converters 125A through 125C of the PGA unit 115. Further, the auto calibration circuit 117 outputs a response signal indicative of the completion of the calibration process to the controller 118.

When the completion of the calibration process is notified to the controller 118, the auto calibration mode signal T21 is lowered to a low level and at the same time the reception mode signal T3 is raised to activate the low noise amplifier 112A and shift it to the reception mode. It is thus possible to receive a signal from the antenna. When the received signal passes through the low noise amplifier 112A, the mixer 113 and the PGA unit 115, it is demodulated/amplified to a baseband signal, followed by input to the baseband & system control part 150.

When the series of receiving processes are completed, the baseband & system control part 150 outputs a command for transition to an idle mode (sleep mode) to the controller 118 of the reception-system circuit 110. The controller 118 of the reception-system circuit 110 changes the control signals T1 and T2 and the reception mode signal T3 to a low level, based on the command and interrupts the operating current having flowed through the current source in each amplifier of the reception-system circuit 110, thereby making transition to the idle mode (standby state).

While the invention made by the present inventors as described above has been described specifically by the illustrated embodiments, the present invention is not limited to the above embodiments. It is needless to say that various changes can be made thereto within the scope not departing from the substance thereof. Although the gain variable amplifier AMP1 is provided even in the stage prior to the mixer 113 in the reception-system circuit employed in the embodiment, for example, the present amplifier may be omitted. While the gain variable amplifier 115 provided in the subsequent stage of the mixer 113 is configured in the three stages, the number of the stages may be two or four or more.

While the above description has principally been made of the case in which the invention made by the present inventors is applied to the signal processing semiconductor integrated circuit device of the direct conversion system used in the cellular telephone, which belongs to the field of application corresponding to the background of the invention, the present invention is not limited to it. The present invention can widely be used in a semiconductor integrated circuit device with a built-in analog circuit, wherein a plurality of amplifiers are connected in multi stage in the form of DC coupling.

While the above description has principally been made of the case in which the invention made by the present inventors is applied to the signal processing semiconductor integrated circuit device of the direct conversion system used in the cellular telephone, which belongs to the field of application corresponding to the background of the invention, the present invention is not limited to it. The present invention can be used in an analog circuit having a configuration wherein a plurality of amplifiers are connected in multistage form, and a semiconductor integrated circuit device having the analog circuit built therein.

Advantageous effects obtained by a typical one of the inventions disclosed in the present application will be described in brief as follows:

Namely, a signal processing semiconductor integrated circuit device of a direct conversion system is capable of suppressing a DC voltage variation in the output of each variable gain amplifier upon the transition to a reception mode, reproducing stable receiving characteristics, and improving receiving sensitivity.

What is claimed is:

1. A signal processing semiconductor integrated circuit device, comprising:
    a reception-system circuit including,
        a first amplifier circuit which amplifies a received signal;
        a frequency converter which combines the amplified signal with an oscillation signal having a predetermined frequency to thereby effect frequency conversion on the combined signal; and
        a second amplifier circuit which is DC-coupled to the frequency converter and amplifies the signal frequency-converted by the frequency converter;
    said signal processing semiconductor integrated circuit device having a first operation mode in which the reception-system circuit is activated and a second operation mode in which the reception-system circuit is deactivated;
    wherein voltage reference circuits, which respectively generate bias voltages for current sources for supplying operating currents for the frequency converter means and the second amplifier circuit, are activated in response to a transition from the second operation mode to the first operation mode, and thereafter the bias voltages are transferred to the current sources of the frequency converter and the second amplifier circuit to thereby activate the frequency converter and the second amplifier circuit.

2. The signal processing semiconductor integrated circuit device according to claim 1, wherein after the bias voltages are transferred to the current sources of the frequency converter and the second amplifier circuit, the second amplifier circuit performs a calibration for reducing a DC offset included in an output signal, and the first amplifier circuit is activated after the elapse of a predetermined time.

3. The signal processing semiconductor integrated circuit device according to claim 2, wherein the second amplifier circuit comprises a plurality of amplifying stages, and each of the amplifying stages performs a calibration for reducing a DC offset included in an output signal.

4. The signal processing semiconductor integrated circuit device according to claim 3, wherein the voltage reference circuits are provided in plural form in association with each of the first amplifier circuit, the frequency converter means and the second amplifying circuit.

5. The signal processing semiconductor integrated circuit device according to claim 1, wherein a third amplifier circuit is connected to the input side of the frequency converter, and after the voltage reference circuits are activated, bias voltages produced therefrom are transferred to their corresponding current sources of the third amplifier circuit, the frequency converter and the second amplifier circuit, so that the second amplifier circuit performs a calibration for reducing a DC offset included in an output.

6. The signal processing semiconductor integrated circuit device according to claim 5, wherein after the completion of the calibration by the second amplifier circuit, the transfer of the bias voltage to the current source of the third amplifier circuit is interrupted, and the transfer of the bias voltage to the current source of the first amplifier circuit is carried out.

7. A signal processing semiconductor integrated circuit device according to claim 1, further comprising:
a transmission-system circuit modulates a transmit signal, and combines the modulated signal with an oscillation signal to thereby effect frequency conversion on the combined signal;
a control-system circuit which controls the reception-system circuit and the transmission-system circuit; and
an oscillation-system circuit which generates an oscillation signal or an oscillation control signal combined by the reception-system circuit and the transmission-system circuit,
all being formed on a single semiconductor substrate.

8. The signal processing semiconductor integrated circuit device according to claim 7, wherein a third amplifier circuit is connected to the input side of the frequency converter, and wherein after the voltage reference circuits are activated, bias voltages produced therefrom are transferred to their corresponding current sources of the third amplifier circuit, the frequency converter and the second amplifier circuit, so that the second amplifier circuit performs a calibration for reducting a DC offset included in an output.

9. The signal processing semiconductor integrated circuit device according to claim 8, wherein after the completion of the calibration by the second amplifier circuit, the transfer of the bias voltage to the current source of the third amplifier circuit is interrupted, and the transfer of the bias voltage to the current source of the first amplifier circuit is carried out.

10. A wireless communication system, comprising:
a signal processing semiconductor integrated circuit device according to claim 7; and
a baseband circuit which performs signal processing for performing the conversion of a signal outputted from the reception-system circuit to a voice signal and the conversion of the voice signal to the transmit signal, and controls the signal processing semiconductor integrated circuit device;
wherein a first command signal for activating the voltage reference circuits and a second command signal for activating the frequency converter and the second amplifier circuit are supplied from the baseband circuit.

11. The wireless communication system according to claim 10, wherein the first command signal for activating the voltage reference circuits and the second command signal for activating the frequency converter and the second amplifier circuit are supplied from the baseband circuit to the control-system circuit.

12. The signal processing semiconductor integrated circuit device according to claim 1, wherein after the voltage reference circuits are activated, bias voltages produced therefrom are transferred to corresponding current sources of a third amplifier circuit, the frequency converter and the second amplifier circuit, so that the second amplifier circuit performs a calibration for reducing a DC offset included in an output.

13. The signal processing semiconductor integrated circuit device according to claim 12, wherein after the completion of the calibration by the second amplifier circuit, the transfer of the bias voltage to the current source of the third amplifier circuit is interrupted, and the transfer of the bias voltage to the current source of the first amplifier circuit is carried out.

14. A method of controlling a signal processing semiconductor integrated circuit device which comprises a reception-system circuit including a first amplifier circuit which amplifies a received signal; a frequency converter which combines the amplified signal with an oscillation signal having a predetermined frequency to thereby effect frequency conversion on the combined signal; and a second amplifier circuit which is DC-coupled to the frequency converter and amplifies the signal frequency-converted by the frequency converter, the signal processing semiconductor integrated circuit device having a first operation mode in which the reception-system circuit is activated and a second operation mode in which the reception-system circuit is deactivated, said method comprising the steps of:
activating voltage reference circuits, which respectively generate bias voltages for current sources for supplying operating currents for the frequency converter and the second amplifier circuit, in response to a transition from the second operation mode to the first operation mode; and
after the elapse of a predetermined time, transferring the bias voltages to the current sources of the frequency converter and the second amplifier circuit to thereby activate the frequency converter and the second amplifier circuit respectively.

* * * * *